United States Patent
Kikuchi et al.

(10) Patent No.: US 7,880,553 B2
(45) Date of Patent: Feb. 1, 2011

(54) OSCILLATION CIRCUIT WITH TEMPERATURE COMPENSATION

(75) Inventors: Jun Kikuchi, Tochigi (JP); Toru Matsumoto, Tochigi (JP); Kaoru Kanehachi, Tochigi (JP)

(73) Assignee: Seiko NPC Kabushiki Kaisha, Tokyo (JP)

(*) Notice: Subject to any disclaimer, the term of this patent is extended or adjusted under 35 U.S.C. 154(b) by 127 days.

(21) Appl. No.: 12/382,348

(22) Filed: Mar. 13, 2009

(65) Prior Publication Data
US 2009/0231049 A1 Sep. 17, 2009

(30) Foreign Application Priority Data
Mar. 17, 2008 (JP) .............................. 2008-067580

(51) Int. Cl.
*H03L 1/00* (2006.01)
(52) U.S. Cl. .................. 331/176; 331/158; 331/116 R; 331/116 FE
(58) Field of Classification Search ............... 331/158, 331/116 R, 116 FE, 176
See application file for complete search history.

(56) References Cited

U.S. PATENT DOCUMENTS
7,385,453 B2* 6/2008 Nervegna .................. 331/176

FOREIGN PATENT DOCUMENTS
JP 2000-155153 6/2000

OTHER PUBLICATIONS
English Translation of Abstract of JP 2000-155153 dated Jun. 2000.
* cited by examiner

*Primary Examiner*—Arnold Kinkead
(74) *Attorney, Agent, or Firm*—Wenderoth, Lind & Ponack, L.L.P.

(57) ABSTRACT

An oscillation section for which an output frequency is controlled based on a control signal depending on an ambient temperature; a temperature compensation circuit for supplying the control signal to this oscillation section; and a switching switch circuit consisting of an output buffer and a temperature sensor output switch for which ON and OFF are controlled so that any one of an oscillation output from the oscillation section and a temperature sensor output from the temperature compensation circuit is outputted. The temperature sensor output switch is structured so that transfer gate switches are connected in a two-stage serial manner and a third switch connected to a fixed potential is sandwiched between these connection points. When an oscillation output is outputted, the transfer gate switches are OFF and the third switch is ON and, when a temperature sensor output is outputted, the transfer gate switches are ON and the third switch is OFF.

2 Claims, 2 Drawing Sheets

OSCILLATION CIRCUIT WITH TEMPERATURE COMPENSATION

BACKGROUND OF THE INVENTION

The present invention relates to an oscillation circuit having a temperature compensation circuit for compensating a frequency change of an oscillator due to a change in an ambient temperature. In particular, the present invention relates to an oscillation circuit to temporarily stop an oscillation output to output a temperature sensor output of the temperature compensation circuit.

Conventionally, a configuration has been known in which two circuits A and B having different functions and having different input and output pads respectively and the respective input and output pads have therebetween switching switches consisting of transfer gate switches. By controlling the ON and OFF of these switching switches by a signal from a test controller, any one of the two circuits A and B is selected to be operable and an output from the selected circuit is outputted from a test terminal shared by the two circuits or is outputted from the output pad of the circuit. This type of conventional circuit is disclosed in Japanese Unexamined Patent Application Publication No. 2000-155153.

However, the conventional switching switch has a disadvantage as shown below. Specifically, in an OFF status, a parasitic capacitance functions as a bypass path as shown in FIG. 2 and the output from the one circuit A leaks to the other circuit B to cause noise, causing an adverse influence on the operation of the circuit B. This disadvantage is particularly conspicuous when the circuit A is an oscillation circuit having an oscillator of a frequency temperature characteristic changing depending on an ambient temperature and the circuit B is a temperature compensation circuit for supplying a frequency control signal depending on the ambient temperature to this oscillation circuit and thus low noise is required for the circuit B receiving the output leaked from the circuit A. Specifically, a frequency control signal of the temperature compensation circuit is influenced by noise to cause an adverse influence on the operation of a variable capacity diode of an oscillation section to deteriorate the frequency temperature characteristic or to cause phase noise. The conventional design also has another disadvantage in which the input and output pads of the respective circuits A and B occupy a large area in an apparatus accommodating the circuits A and B and thus the reduction of the area in the apparatus is inhibited.

SUMMARY OF THE INVENTION

It is an objective of the present invention to provide an oscillation circuit that solves the above-described respective disadvantages.

In order to achieve this objective, an oscillation circuit of the present invention includes: an oscillation section; a temperature compensation circuit having a temperature sensor for measuring an ambient temperature; and a switching switch circuit. An output frequency of the oscillation section is controlled based on a control signal depending on an ambient temperature supplied from the temperature compensation circuit (oscillation frequency control signal). The temperature compensation circuit supplies, to the oscillation section, the control signal that depends on an ambient temperature measured by the temperature sensor. The switching switch circuit consists of an oscillation output switch and a temperature sensor output switch for which ON and OFF are controlled so that any one of an oscillation output from the oscillation section and a temperature sensor output from the temperature compensation circuit is selectively outputted. The temperature sensor output switch is structured so that transfer gate switches are connected in a two-stage serial manner and a third switch connected to a fixed potential is sandwiched between these connection points. The switching switch circuit is configured so that, when the oscillation output switch is ON, the respective transfer gate switches of the temperature sensor output switch are OFF and the third switch is ON and, when the oscillation output switch is OFF, the respective transfer gate switches of the temperature sensor output switch are ON and the third switch is OFF.

A more specific configuration of the oscillation circuit of the present invention may be the one including, in addition to the above-described oscillation section, temperature compensation circuit, and switching switch circuit, an input terminal to which a control signal for controlling the switching switch circuit is inputted, a temperature sensor output controller for controlling ON and OFF of a temperature sensor output switch depending on the inputted control signal, and an output terminal for outputting an output selected by the switching switch circuit. The switching switch circuit is configured so that, when an oscillation output is outputted to the output terminal, the oscillation output switch is turned ON and, when the respective transfer gate switches are OFF and the third switch is ON and a temperature sensor output is outputted to the output terminal, the oscillation output switch is turned OFF and the respective transfer gate switches are turned ON to turn OFF the third switch.

DESCRIPTION OF THE PREFERRED EMBODIMENTS

Figure 1:
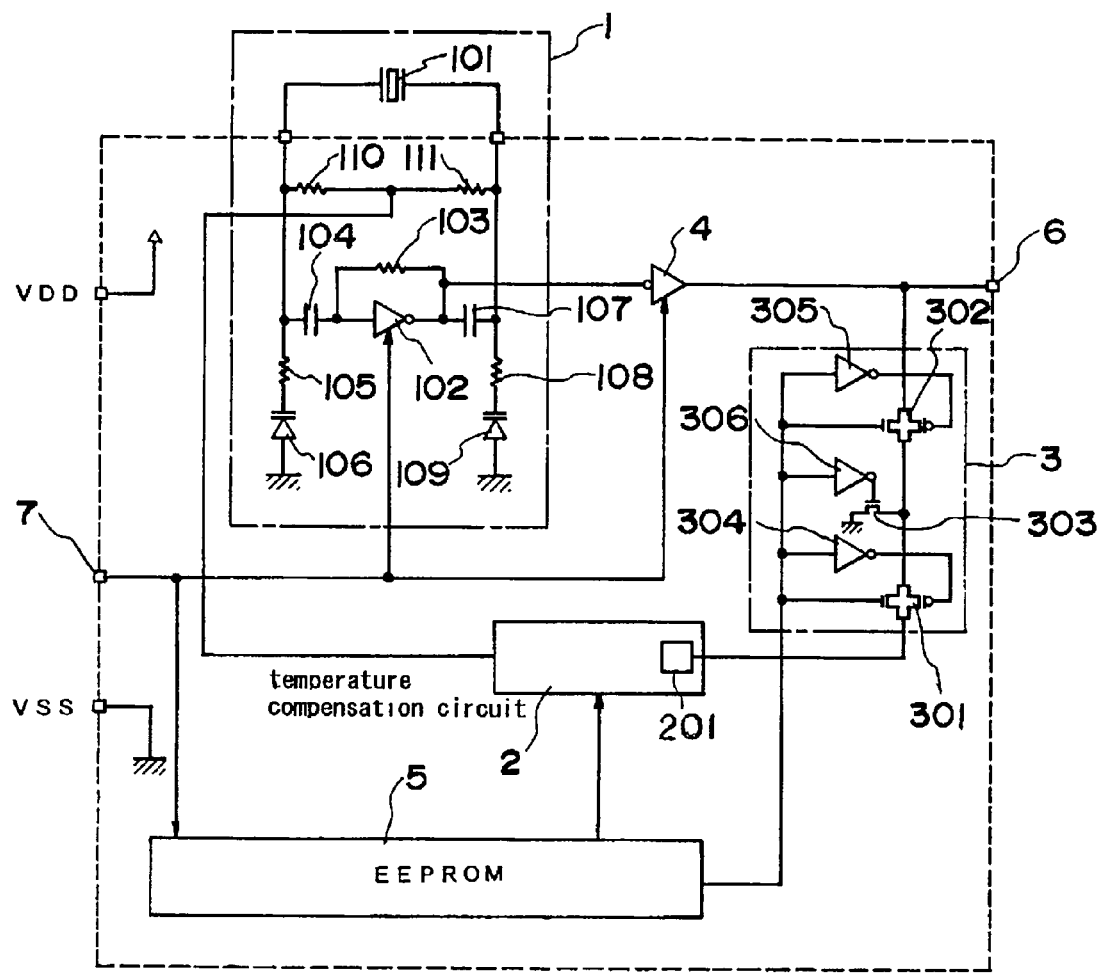
FIG. 1 is a circuit diagram illustrating one embodiment of an oscillation circuit according to the present invention.
Figure 2:
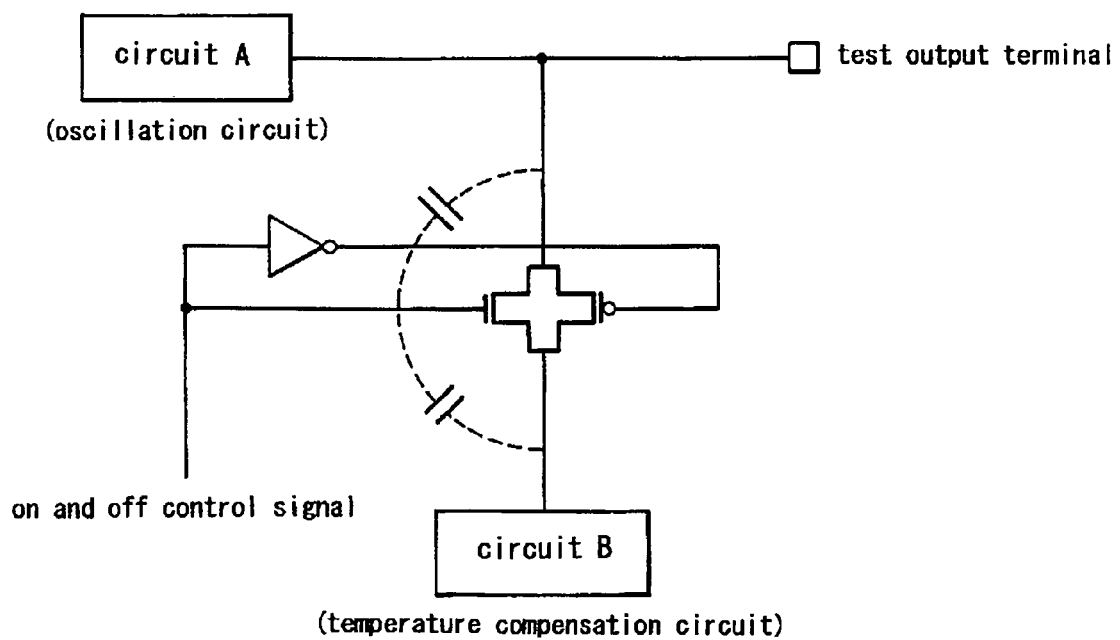
FIG. 2 is a circuit diagram illustrating a parasitic capacitance in a conventional transfer gate switch.

With reference to FIG. 1, the following section will describe a preferred embodiment of an oscillation circuit according to the present invention. A part surrounded by the broken line shows a crystal oscillation module IC. The oscillation circuit includes: an oscillation section 1; a temperature compensation circuit 2; a temperature sensor output switch 3; an output buffer 4; and an EEPROM 5. The temperature compensation circuit 2 includes a temperature sensor 201. The temperature sensor output switch 3 and the output buffer 4 functioning as an oscillation output switch constitute a switching switch circuit. The EEPROM 5 constitutes a temperature sensor output controller.

The reference numeral 6 denotes an output terminal from which any one of an oscillation output of the oscillation section 1 or a temperature sensor output of the temperature compensation circuit 2 is outputted. The reference numeral 7 denotes an input terminal and is a mode switching signal input terminal to which a control signal for switching an oscillation output mode for outputting an oscillation output and a test mode for outputting a temperature sensor output is inputted. This mode switching signal input terminal 7 also functions as a terminal to which data written to the EEPROM 5 is inputted.

A crystal oscillator 101 of the oscillation section 1 is externally attached as an external element and is parallely-connected to a feedback resister 103 of an inverting amplification circuit 102. An input end of the inverting amplification circuit 102 is grounded via a capacitor 104, resistance 105, and a variable capacity diode 106 and the output end thereof is grounded via a capacitor 107, resistance 108, and a variable capacity diode 109. The inverting amplification circuit 102 is parallely-connected to resistances 110 and 111.

A midpoint of the connection between the respective resistances 110 and 111 is connected to the output end of the temperature compensation circuit 2. The oscillation section 1 receives an oscillation frequency control signal that is outputted from the temperature compensation circuit 2 depending on the ambient temperature measured by a temperature sensor 201. This oscillation frequency control signal is inputted to the respective variable capacity diodes 106 and 109 via the resistances 110, 105, 111, and 108, respectively. When a voltage value shown by the oscillation frequency control signal increases, the capacitance values of the respective variable capacity diodes 106 and 109 decrease and an oscillation frequency increases.

On the other hand, the output from the oscillation section 1 is outputted from an output terminal 6 via the output buffer 4. A mode-switching signal input terminal 7 is connected to the inverting amplification circuit 102, the output buffer 4, and the EEPROM 5. In accordance with a control signal inputted to the mode switching signal input terminal 7, the ON and OFF of the inverting amplification circuit 102 and the output buffer 4 are controlled and the latch output of the EEPROM 5 is controlled, thereby controlling the outputs of the oscillation section 1 and the temperature compensation circuit 2. Furthermore, in accordance with the data inputted to the mode switching signal input terminal 7, data in the EEPROM 5 is rewritten.

The temperature sensor output switch 3, which is provided between the output end of the output buffer 4 and the output end of the temperature sensor 201 of the temperature compensation circuit 2, is structured so that transfer gate switches 301 and 302 composed of an N channel MOS transistor and a P channel MOS transistor respectively are connected in a two-stage serial manner. The third switch 303 consisting of the N channel MOS transistor is connected between the connection points of these respective switches 301 and 302 and a fixed potential (grounded in the shown example).

The transfer gate switches 301 and 302 are connected so that a latch output from the EEPROM 5 is directly inputted to the gates of the respective N channel MOS transistors of the transfer gate switches 301 and 302 and a latch output from the EEPROM 5 is inputted to the gates of the respective P channel MOS transistors via inverters 304 and 305, respectively. The third switch 303 is also connected so that the latch output from the EEPROM 5 is inputted to the gate of the N channel MOS transistor as the third switch 303 via an inverter 306. Thus, when the temperature sensor output switch 3 is in an ON status (i.e., when the transfer gate switches 301 and 302 are in an ON status), the third switch 303 is in an OFF status. When the temperature sensor output switch 3 is in an OFF status (i.e., when the transfer gate switches 301 and 302 are in an OFF status), the third switch 303 is in an ON status.

Next, the following section will describe the operation of the above-described oscillation circuit. This oscillation circuit has two operation modes of an oscillation output mode and a test mode for monitoring the output from the temperature sensor. First, the operation of the oscillation output mode will be described. In the oscillation output mode, a control signal of a level H is inputted from the mode switching signal input terminal 7 to operate the oscillation section 1 and the output buffer 4 and the latch output of the EEPROM 5 is caused to have a level L to turn OFF the temperature sensor output switch 3. As a result, a normal oscillation output is outputted from the output terminal 6. In this case, the third switch 303 of the temperature sensor output switch 3 is in an ON status. Thus, the leakage of the oscillation output caused via the parasitic capacitance of the respective transfer gate switches 301 and 302 as a bypass path is reduced to a fixed potential via the switch 303 and is prevented from flowing to the temperature compensation circuit 2.

Next, in the test mode, a control signal of the level L is inputted from the mode switching signal input terminal 7 to cause the output of the oscillation section 1 and the output buffer 4 to have high impedance to stop the operation of the oscillation section 1. On the other hand, the latch output of the EEPROM 5 is caused to have the level H to turn ON the temperature sensor output switch 3. As a result, the output terminal 6 outputs a reference voltage for comparing the temperature sensor output outputted from the temperature compensation circuit 2 with a temperature sensor output generated by another known means. The reference voltage is, for example, a bandgap voltage or a bandgap voltage subjected to resistance division. In this case, the third switch 303 of the temperature sensor output switch 3 is in an OFF status. Then, based on the result of the output from the output terminal 6, a change in the capacitance value of the oscillation section 1 due to the oscillation frequency control signal of the temperature compensation circuit 2 and the proportional temperature compensation characteristic can be evaluated.

The present invention is not limited to the above-described embodiment. For example, the third switch 303 also may be composed of a bipolar transistor instead of a MOS transistor. The fixed potential connected to the third switch 303 also may be Vdd or Vss instead of being grounded.

According to the present invention, the temperature sensor output switch is composed of transfer switches connected in a two-stage serial and the third switch connected to the connection point thereof and a fixed potential. Through this structure, the output of the oscillation section leaked via the parasitic capacitance of the transfer switch is reduced to a fixed potential via the third switch. This consequently prevents the output of the oscillation section from being inputted as noise to the temperature compensation circuit, thus eliminating an influence by noise on a control signal supplied by the temperature compensation circuit. Since no noise is inputted to the temperature compensation circuit via the parasitic capacitance as described above, no adverse influence on the frequency temperature characteristic of the oscillation section or phase noise is caused. This structure also does not require output pads to be individually provided to the oscillation section and the temperature compensation circuit, thus advantageously reducing the area in the apparatus in which the oscillation circuit is provided.

What is claimed is:

1. An oscillation circuit, comprising:
   an oscillation section for which an output frequency is controlled based on a control signal depending on an ambient temperature;
   a temperature compensation circuit for supplying the control signal to this oscillation section; and
   a switching switch circuit consisting of an oscillation output switch and a temperature sensor output switch for which ON and OFF are controlled so that any one of an oscillation output from the oscillation section and a temperature sensor output from the temperature compensation circuit is selectively outputted,
   wherein the temperature sensor output switch is structured so that transfer gate switches are connected in a two-stage serial manner and a third switch connected to a fixed potential is sandwiched between these connection points, and the switching switch circuit is configured so that, when the oscillation output switch is ON, the respective transfer gate switches of the temperature sensor output switch are OFF and the third switch is ON and, when the oscillation output switch is OFF, the respective transfer gate switches of the temperature sensor output switch are ON and the third switch is OFF.

2. An oscillation circuit comprising, in addition to the configuration according to claim 1, an input terminal to which a control signal for controlling the switching switch circuit is inputted;

a temperature sensor output controller for controlling ON and OFF of a temperature sensor output switch of the switching switch circuit depending on the inputted control signal; and an output terminal for outputting an output selected by the switching switch circuit, wherein the switching switch circuit is configured so that, when an oscillation output is outputted to the output terminal, the oscillation output switch is turned ON and, when the respective transfer gate switches are OFF and the third switch is ON and a temperature sensor output is outputted to the output terminal, the oscillation output switch is turned OFF and the respective transfer gate switches are turned ON to turn OFF the third switch.

* * * * *